(12) United States Patent
Fujii

(10) Patent No.: US 11,297,212 B2
(45) Date of Patent: Apr. 5, 2022

(54) IMAGING APPARATUS

(71) Applicant: CANON KABUSHIKI KAISHA, Tokyo (JP)

(72) Inventor: Kazuki Fujii, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 437 days.

(21) Appl. No.: 16/355,526

(22) Filed: Mar. 15, 2019

(65) Prior Publication Data

US 2019/0312997 A1    Oct. 10, 2019

(30) Foreign Application Priority Data

Apr. 5, 2018 (JP) .............................. JP2018-073304
Apr. 24, 2018 (JP) .............................. JP2018-083416

(51) Int. Cl.
| | |
|---|---|
| *H04N 5/225* | (2006.01) |
| *G06F 1/16* | (2006.01) |
| *G08B 7/02* | (2006.01) |
| *H05K 1/02* | (2006.01) |
| *G02B 7/02* | (2021.01) |

(52) U.S. Cl.
CPC ........... *H04N 5/2254* (2013.01); *G02B 7/023* (2013.01); *G06F 1/1698* (2013.01); *H04N 5/2252* (2013.01); *H05K 1/028* (2013.01)

(58) Field of Classification Search
USPC .......................................... 348/374; 396/535
See application file for complete search history.

(56) References Cited

U.S. PATENT DOCUMENTS

| | | | | |
|---|---|---|---|---|
| 9,680,231 | B2* | 6/2017 | Asai ..................... | H04B 5/0031 |
| 2003/0023150 | A1* | 1/2003 | Yokoi ................ | A61B 1/00032 |
| | | | | 600/300 |
| 2006/0259933 | A1* | 11/2006 | Fishel ................ | H04N 7/17318 |
| | | | | 725/105 |
| 2010/0302025 | A1* | 12/2010 | Script .................. | G08B 25/005 |
| | | | | 340/539.1 |
| 2011/0096178 | A1* | 4/2011 | Ryu ..................... | H04N 5/2252 |
| | | | | 348/208.2 |
| 2012/0169340 | A1* | 7/2012 | Leussler .............. | G01R 33/345 |
| | | | | 324/309 |

(Continued)

FOREIGN PATENT DOCUMENTS

| | | |
|---|---|---|
| CN | 201042026 Y | 3/2008 |
| CN | 107024818 A | 8/2017 |

(Continued)

*Primary Examiner* — Clayton E. LaBalle
*Assistant Examiner* — Warren K Fenwick
(74) *Attorney, Agent, or Firm* — Canon U.S.A., Inc. IP Division

(57) ABSTRACT

An imaging apparatus includes a housing having an opening, a camera unit including a lens and an imaging device, disposed inside the housing, and configured to image an external object through the opening, a telecommunication member disposed inside the housing and configured to connect a control substrate controlling the camera unit to an imaging device substrate on which at least the imaging device of the camera unit is mounted, and a communication antenna at least partially disposed in a gap between an inner edge of the opening and the camera unit as viewed in an optical axis direction of the camera unit at a position substantially symmetrical to the telecommunication member across the lens.

9 Claims, 10 Drawing Sheets

(56) References Cited

U.S. PATENT DOCUMENTS

| | | | |
|---|---|---|---|
| 2014/0015981 A1* | 1/2014 | Dietl | H04N 5/2251 348/159 |
| 2015/0062333 A1* | 3/2015 | Kilner | H04N 5/2252 348/143 |
| 2017/0116440 A1* | 4/2017 | Huang | G06F 21/6218 |
| 2017/0171451 A1 | 6/2017 | Iwasa | |
| 2020/0084347 A1* | 3/2020 | Kimura | H04N 5/232 |

FOREIGN PATENT DOCUMENTS

| | | |
|---|---|---|
| CN | 108024038 A | 5/2018 |
| JP | 2006345146 A | 12/2006 |
| JP | 2007-60237 A | 3/2007 |
| JP | 2012119975 A | 6/2012 |

* cited by examiner

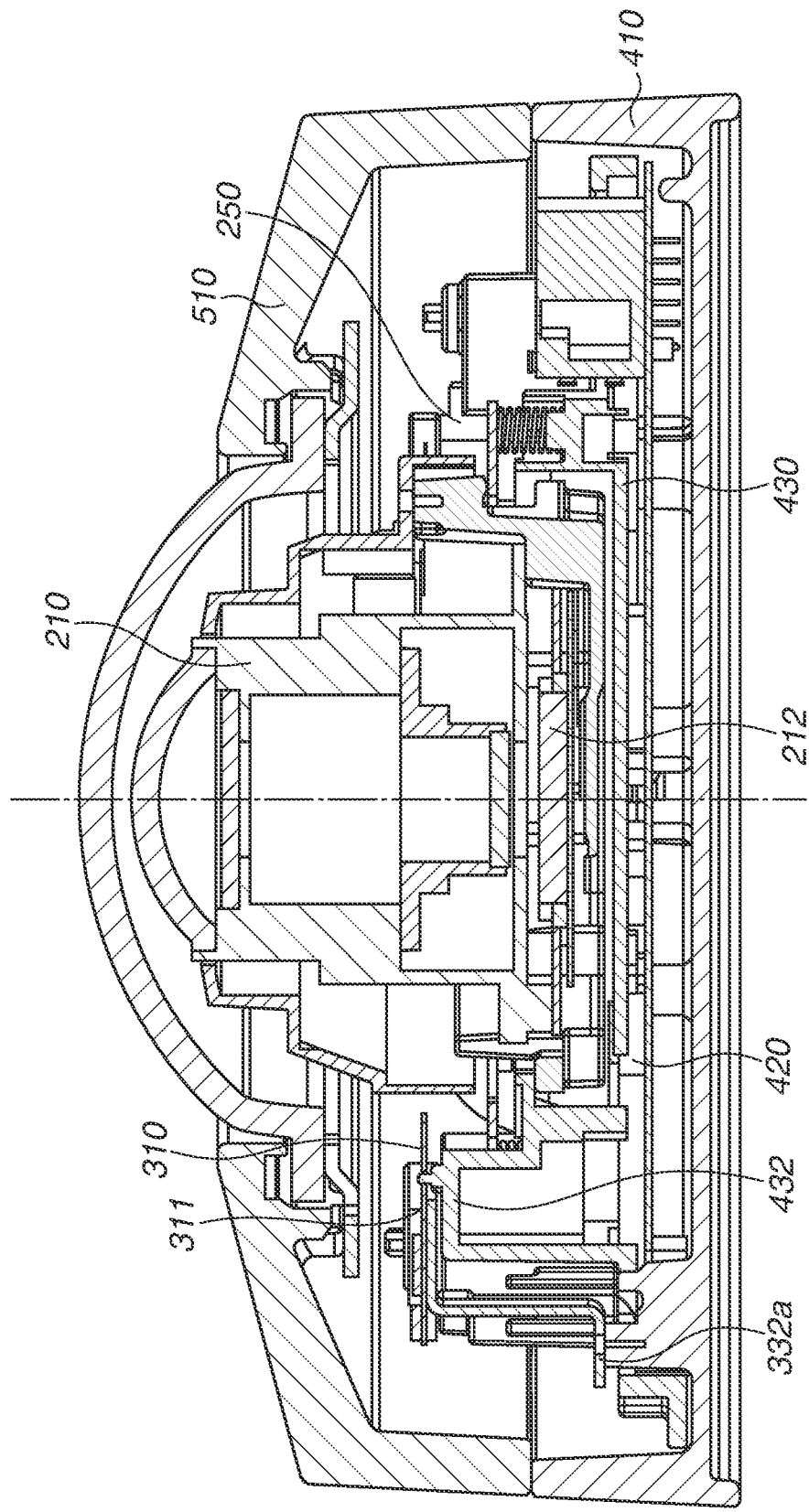

IMAGING APPARATUS

BACKGROUND

Field

The present disclosure relates to an imaging apparatus. More specifically, the present disclosure relates to an imaging apparatus including a wireless communication function.

Description of the Related Art

There is an imaging apparatus that easily transmits data of a captured image to a medium for image browsing not by a wired communication function that involves wiring of devices, but by a wireless communication function. Such an imaging apparatus includes a main substrate that controls components relating to imaging and a wireless communication substrate to transmit data, such as image data, through wireless communication.

As an imaging apparatus including a wireless communication antenna, for example, Japanese Patent Application Laid-Open No. 2007-60237 discusses a camera including a wireless communication function. In the camera discussed in Japanese Patent Application Laid-Open No. 2007-60237, a wireless communication substrate on which a wireless communication circuit and a ground antenna have been mounted is disposed inside a metal cover, and the antenna is grounded through the metal cover. On a predetermined surface of the metal cover, an opening is formed through which the antenna is protruded. Further, a main substrate that controls a liquid crystal monitor and a light emitting unit of a flashing device is electrically connected to the wireless communication circuit through a connector.

In an existing configuration discussed in Japanese Patent Application Laid-Open No. 2007-60237, the wireless communication antenna is disposed to be adjacent to the main substrate because of space restrictions inside the metal cover. Accordingly, for example, noise that is generated when the light emitting unit of the flashing device operates may be transmitted to the wireless communication antenna and may have an influence on data communication.

SUMMARY

The present disclosure is directed to an imaging apparatus capable of reducing an influence of noise from another control unit during wireless communication.

According to an aspect of the present disclosure, an imaging apparatus includes a housing having an opening, a camera unit including a lens and an imaging device, disposed inside the housing, and configured to image an external object through the opening, a telecommunication member disposed inside the housing and configured to connect a control substrate controlling the camera unit to an imaging device substrate on which at least the imaging device of the camera unit is mounted, and a communication antenna at least partially disposed in a gap between an inner edge of the opening and the camera unit as viewed in an optical axis direction of the camera unit at a position substantially symmetrical to the telecommunication member across the lens.

Further features of various embodiments will become apparent from the following description of exemplary embodiments with reference to the attached drawings.

BRIEF DESCRIPTION OF THE DRAWINGS

FIG. 8 is a cross-sectional view illustrating the imaging apparatus according to the exemplary embodiment.

DESCRIPTION OF THE EMBODIMENTS

Figure 1:
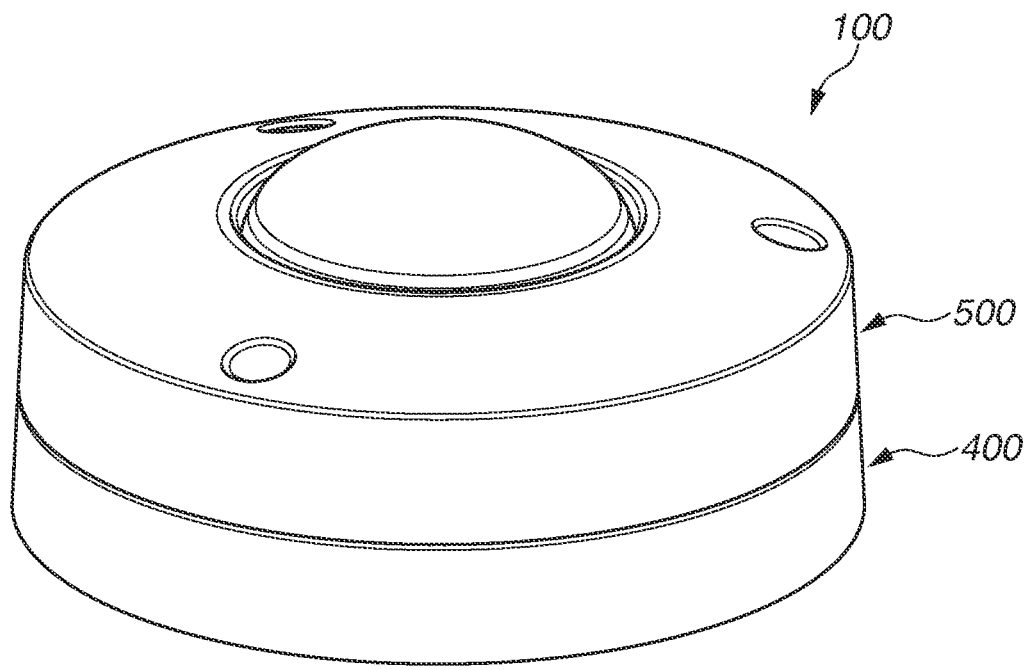
FIG. 1 is a perspective view illustrating an appearance of an imaging apparatus according to an exemplary embodiment.

An exemplary embodiment is described in detail below with reference to the accompanying drawings. In the exemplary embodiment, a dimension, a material, a relative position of components, and the like are merely examples and can be changed depending on a configuration of an apparatus to which the embodiment is applied or various conditions. Further, in the drawings, identical or functionally similar components are denoted respectively by the same reference numerals.

Figure 2:
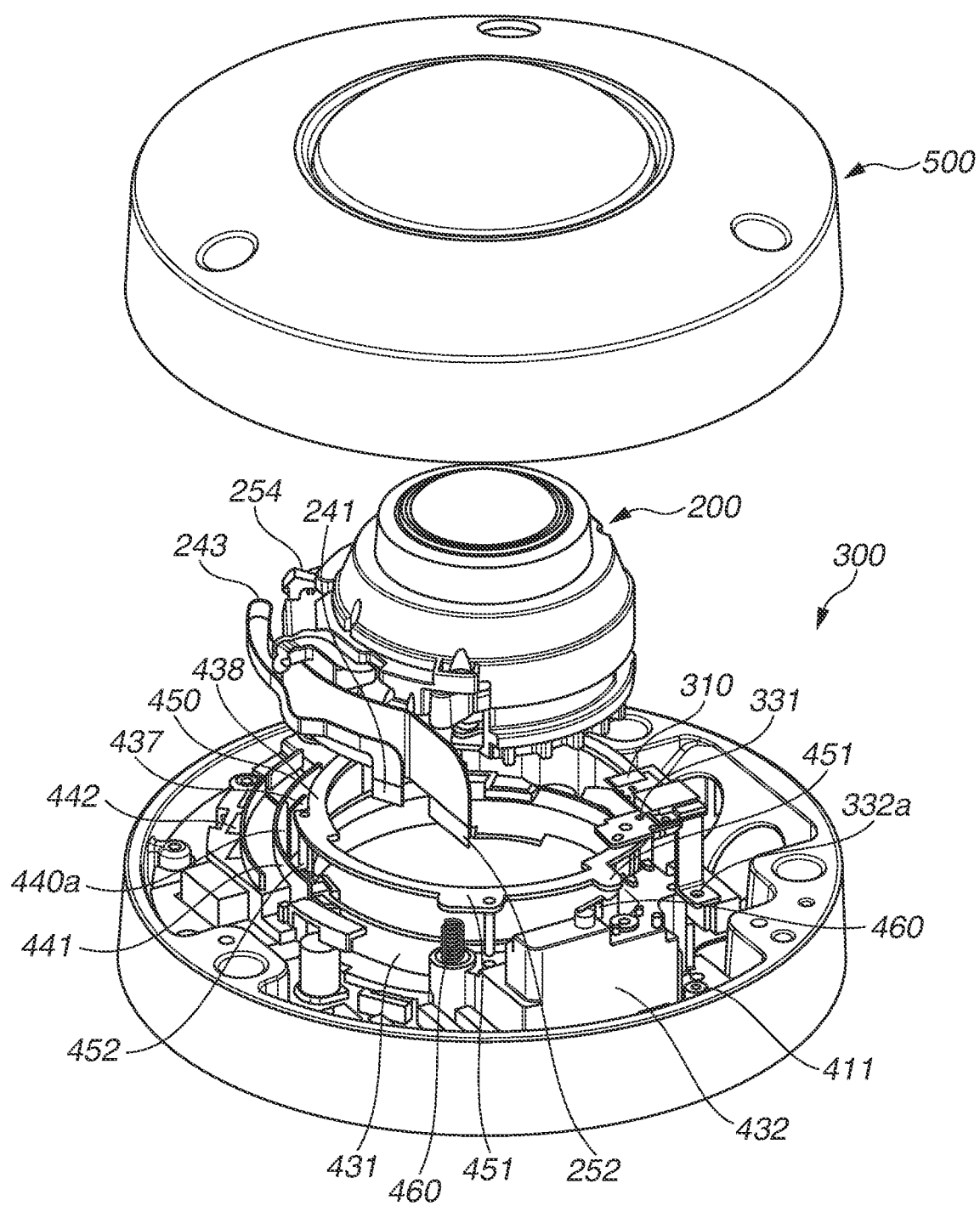
FIG. 2 is an exploded perspective view illustrating the imaging apparatus according to the exemplary embodiment.

First, an entire configuration of an imaging apparatus according to an exemplary embodiment is described with reference to FIGS. 1 and 2. FIG. 1 is a perspective view of an appearance of the imaging apparatus, and FIG. 2 is an exploded perspective view of the imaging apparatus. An imaging apparatus 100 according to the present exemplary embodiment includes a lower housing unit 400 and an upper housing unit 500 that are paired with each other, and the imaging apparatus 100 can be installed on a ceiling or a wall surface of a building using an installation component (not illustrated). A camera unit 200 and a wireless communication unit 300 (both described below) are assembled with the lower housing unit 400. A configuration in which these components are assembled with the lower housing unit 400 is described in detail below.

Figure 3:
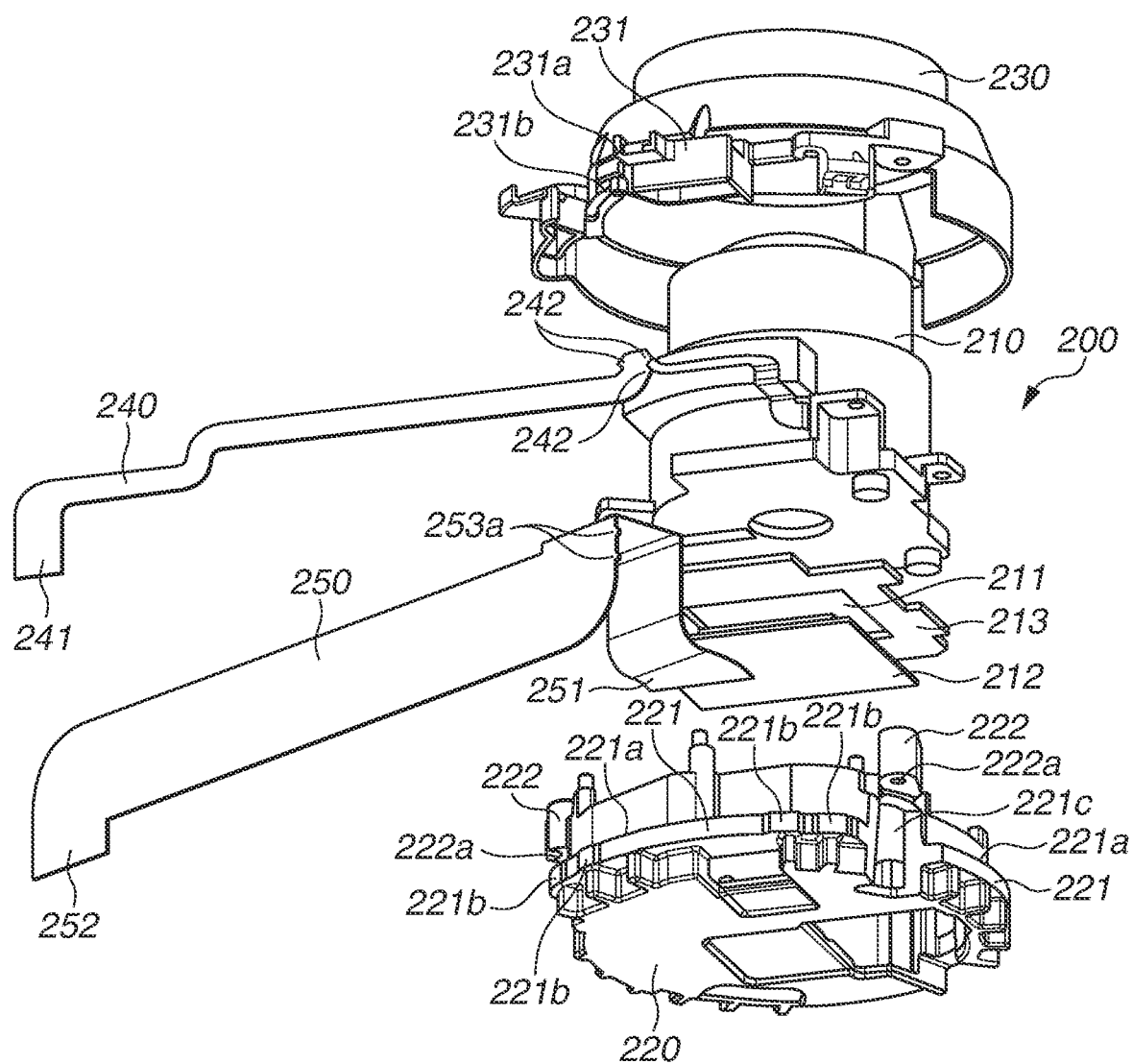
FIG. 3 is an exploded perspective view illustrating a camera unit of the imaging apparatus according to the exemplary embodiment.
Figure 4:
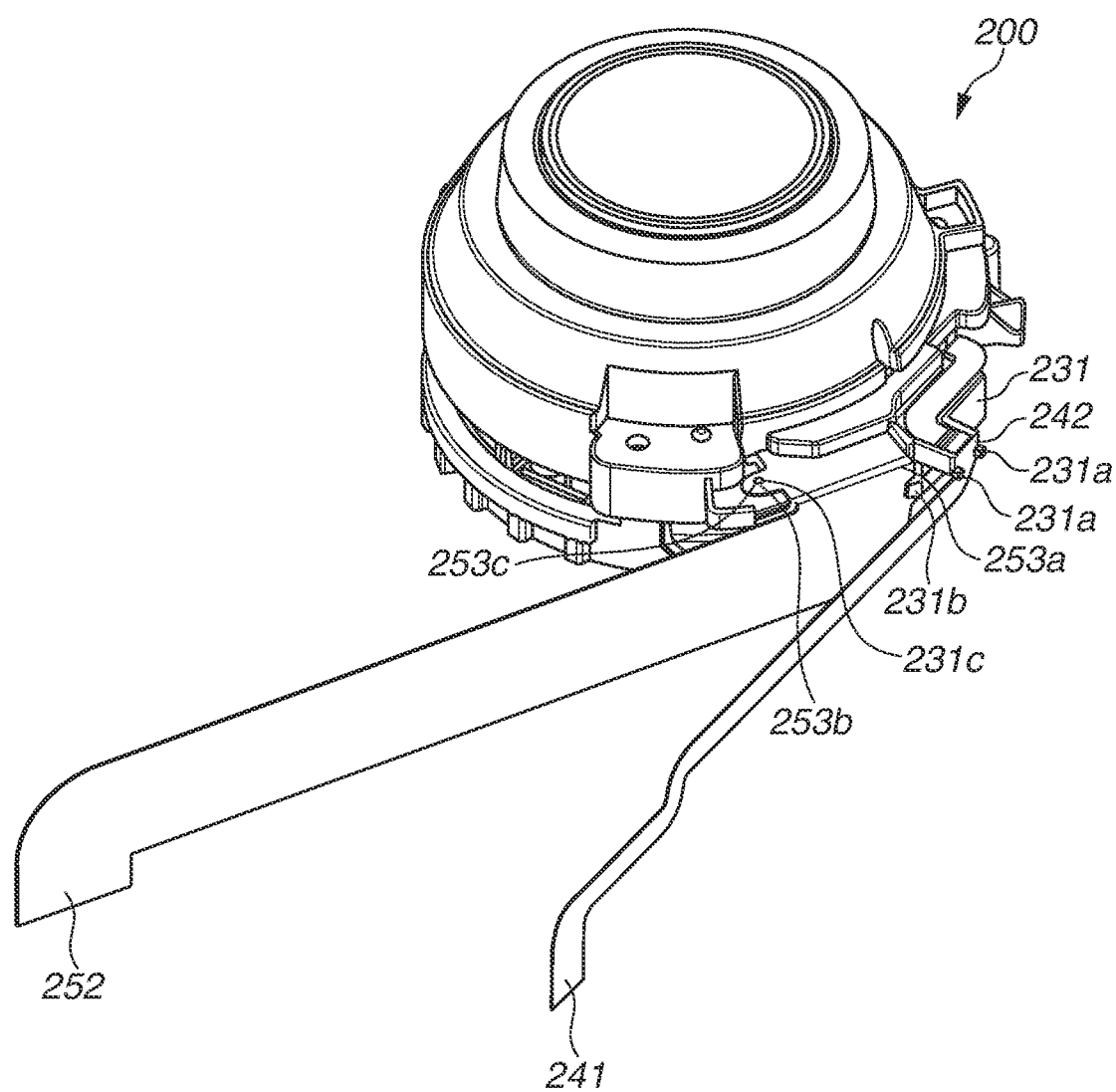
FIG. 4 is a perspective view illustrating the camera unit of the imaging apparatus according to the exemplary embodiment.

A configuration of the above-described camera unit 200 is described with reference to FIGS. 3 and 4. FIG. 3 is an exploded perspective view, and FIG. 4 is a perspective view of the camera unit 200. The camera unit 200, which includes an imaging optical system, images an object and generates an image signal. The camera unit 200 includes a lens barrel unit 210, a holder member 220, a lens barrel cover member 230, a first telecommunication member 240, and a second telecommunication member 250. The holder member 220 fixes and supports the lens barrel unit 210. The lens barrel cover member 230 is fixed to the holder member 220 so as to cover the lens barrel unit 210.

The lens barrel unit 210 includes a plurality of fixed lenses (not illustrated), and includes an electric control diaphragm unit (not illustrated), an imaging device 211, an imaging device substrate 212, and an imaging device substrate holding member 213. A sensor, such as a complementary metal-oxide semiconductor (CMOS) sensor, is used for the imaging device 211. The imaging device 211 is mounted on the imaging device substrate 212, and the imaging device substrate 212 is fixed to the imaging device substrate holding member 213. In FIG. 3, illustration of a method of assembling the plurality of fixed lenses, the diaphragm unit, the imaging device substrate 212, and the imaging device substrate holding member 213 to the lens barrel unit 210 is partially omitted. In the present exemplary embodiment, the lens barrel unit 210 includes only the fixed lenses; however, the type of the lens included in the lens barrel unit 210 is not limited thereto. For example, the lens barrel unit 210 may include a movable lens or a movable lens group that adjusts zooming and focusing.

The holder member 220 is a substantially cylindrical member including a boss for fixing the above-described lens barrel unit 210, and the holder member 220 holds the lens barrel unit 210. The holder member 220 further includes a flange 221 that includes a plurality of sliding surfaces 221a and 221b and a gap 221c. In addition, the holder member 220 also includes, on an end surface of a substantially cylindrical shape thereof on the lens barrel unit 210 side, a plurality of bosses 222 each projecting outward on an outer diameter side of the cylindrical shape and including a protrusion 222a on a bottom surface thereof. In the present exemplary embodiment, the protrusion 222a is formed on the bottom surface of each of the plurality of bosses 222; however, a shape of the bottom surface of each of the bosses 222 is not limited thereto. For example, the bottom surface may have a shape not including the protrusion 222a.

The lens barrel cover member 230 is a substantially cylindrical member including an opening into which the lens barrel unit 210 and the holder member 220 are inserted and through which a front lens of the lens barrel unit 210 is exposed. The lens barrel cover member 230 includes a flange 231 that projects outward on the outer diameter side. The flange 231 includes clamp-shaped portions 231a and 231b and a boss pin 231c.

The first telecommunication member 240 transmits a signal to electrically control the lens barrel unit 210, for example, an electric signal to control the diaphragm unit. In the present exemplary embodiment, the first telecommunication member 240 is, for example, a flexible printed-circuit (FPC) board. The first telecommunication member 240 includes a free end (not illustrated), a fixing end 241, and tongue-shaped portions 242. The free end is fixed and connected to the electric control diaphragm unit. The plurality of tongue-shaped portions 242 are formed so as to project from the substrate (flexible printed-circuit board) in a width direction thereof between the free end and the fixing end 241.

The first telecommunication member 240 is assembled to be fixed and connected to the diaphragm unit and the like so as to project outward on the outer diameter side of the lens barrel unit 210, the holder member 220, and the lens barrel cover member 230. Subsequently, the first telecommunication member 240 is routed along the flange 231 of the lens barrel cover member 230, and the tongue-shaped portions 242 are clamped by the clamp-shaped portion 231a of the lens barrel cover member 230. The first telecommunication member 240 is folded such that the width direction of the first telecommunication member 240 and an axis direction of the lens barrel cover member 230 are substantially coincident with each other, through the assembly in the above-described manner.

The second telecommunication member 250 transmits the image signal acquired by the imaging device 211. In the present exemplary embodiment, the second telecommunication member 250 is, for example, an FPC board. The second telecommunication member 250 includes a free end 251, a fixing end 252, and a plurality of tongue-shaped portions 253a and 253b. The tongue-shaped portions 253a and 253b are formed so as to project from the substrate (flexible printed-circuit board) in a width direction thereof between the free end 251 and the fixing end 252. The tongue-shaped portion 253b includes an engagement hole 253c.

The free end 251 of the second telecommunication member 250 is connected to a connector (not illustrated) mounted on the imaging device substrate 212, and first, the second telecommunication member 250 is laid along an inner surface of the holder member 220. Next, the second telecommunication member 250 projects outward on the outer diameter side of the lens barrel unit 210, the holder member 220, and the lens barrel cover member 230, and is assembled so as to extend along the flange 231 of the lens barrel cover member 230. The tongue-shaped portion 253b is clamped by the clamp-shaped portion 231b of the lens barrel cover member 230, and the engagement hole 253c engages with the boss pin 231c of the lens barrel cover member 230. The second telecommunication member 250 is folded such that the width direction of the second telecommunication member 250 and the axis direction of the lens barrel cover member 230 are substantially coincident with each other, through the assembly in the above-described manner.

Figure 5:
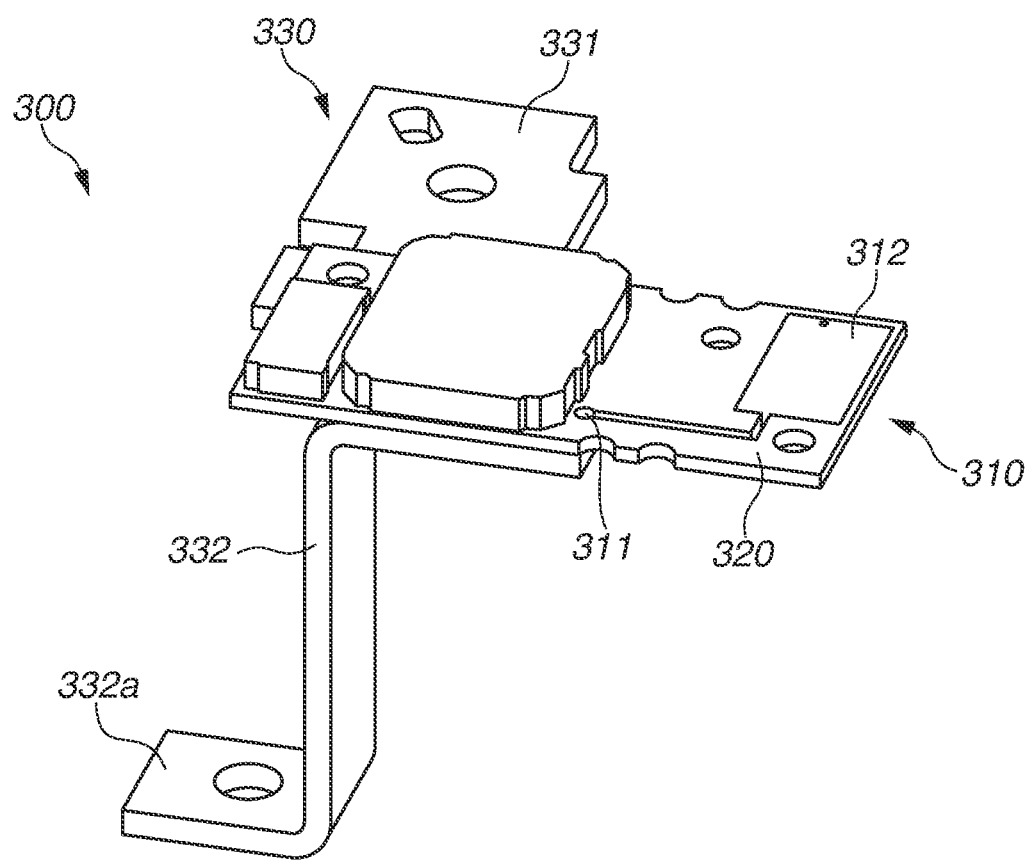
FIG. 5 is a perspective view illustrating a wireless communication unit of the imaging apparatus according to the exemplary embodiment.

Next, the wireless communication unit 300 is described with reference to FIG. 5. The wireless communication unit 300 includes a communication antenna 310, a communication substrate 320, and a wireless communication unit holding member 330. The communication antenna 310 is used to radiate a radio wave. The communication antenna 310 is mounted on the communication substrate 320. The wireless communication unit holding member 330 holds the communication substrate 320.

The communication antenna 310 includes a feeding point 311 and a main antenna area 312, and includes an antenna length corresponding to an operating radio band. The communication substrate 320 is electrically connected to another electric substrate via a flexible printed-circuit board (not illustrated). The wireless communication unit holding member 330 is a sheet metal member, and includes a planar part 331 and a bent part 332 extending from the planar part 331. In the present exemplary embodiment, the wireless communication unit holding member 330 is a sheet metal member; however, a form of the wireless communication unit holding member 330 is not limited thereto. For example, the wireless communication unit holding member 330 may be a metal molded member provided with a planar part and a bent part.

The communication substrate 320 is fixed to the wireless communication unit holding member 330 with a screw (not illustrated) or other fastening member. At this time, the communication antenna 310 is disposed so that the planar part 331 of the wireless communication unit holding member 330 is located immediately below the feeding point 311. Further, the main antenna area 312 is disposed so that the planar part 331 of the wireless communication unit holding member 330 is not located just below the main antenna area 312. A leading end of the bent part 332 (bent part leading end 332a) of the wireless communication unit holding member 330 is connected to an electrical ground. The bent part 332 is provided to have a bent length such that a length from the feeding point 311 of the communication antenna 310 to a connection point where the bent part leading end 332a is connected to the electrical ground is larger than one-fourth of a length of the radio wave, in a state where the wireless communication unit 300 is assembled.

Figure 6:
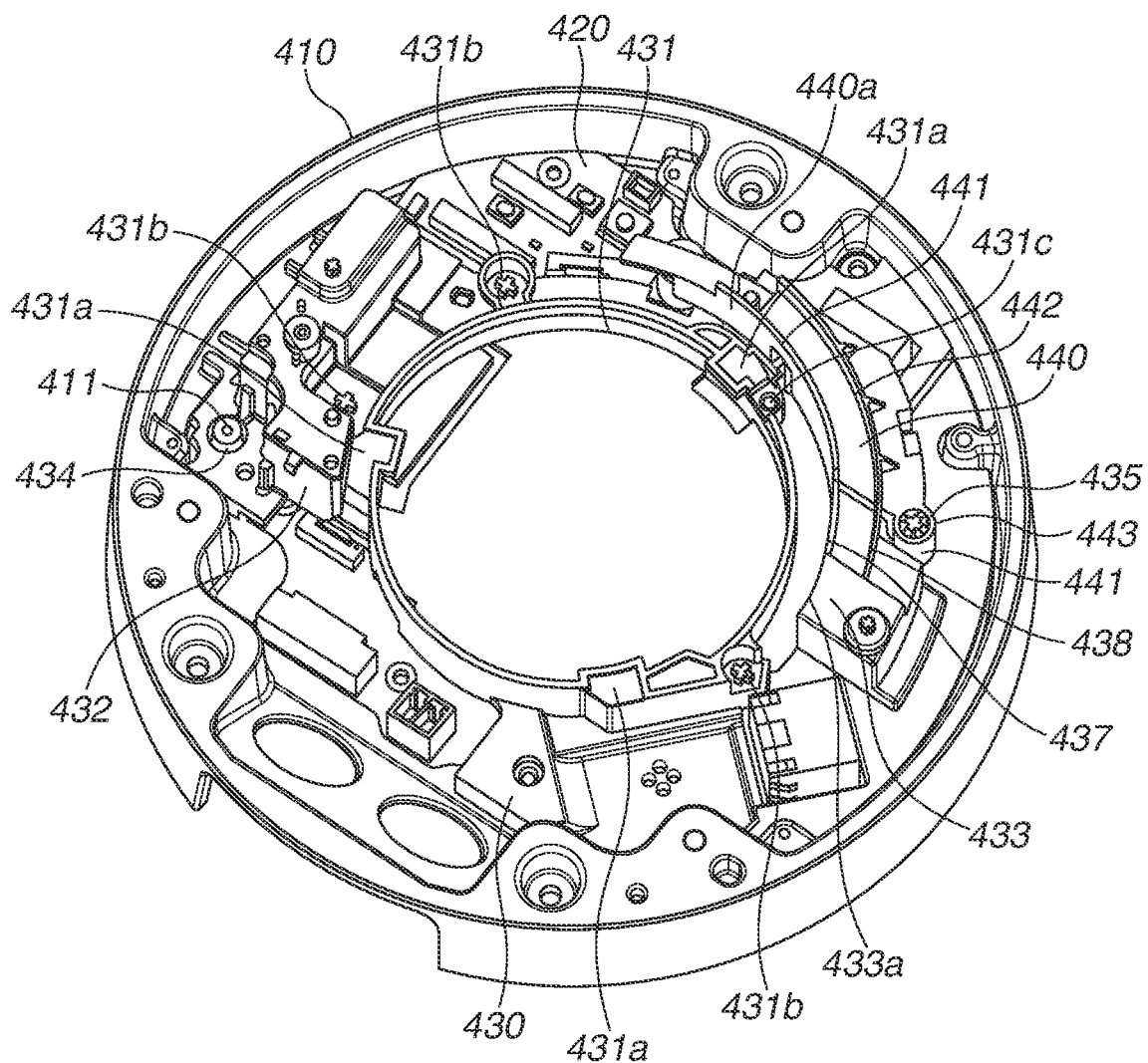
FIG. 6 is a perspective view illustrating a lower housing unit of the imaging apparatus according to the exemplary embodiment.

Next, the lower housing unit 400 is described with reference to FIG. 6. The lower housing unit 400 includes a lower housing 410, a control substrate 420, a base member 430, a guide member 440, an indirect urging member 450 (see FIG. 2), and an urging member 460 (see FIG. 2). As described above, the camera unit 200 and the wireless communication unit 300 are assembled to the lower housing unit 400.

The lower housing 410 is provided as a substantially cylindrical member including an electromagnetic shielding member, for example, a molded member of a metal, such as aluminum and magnesium. In the cylindrical shape, a surface on the upper housing unit 500 side is open, and on a side surface or a bottom surface, a small-diameter opening, through which a cable for a power supply or for communication passes from outside of the imaging apparatus, is formed. On an inner side of the bottom surface, a plurality of bosses to attach various kinds of components including a boss 411 to connect the bent part leading end 332a of the wireless communication unit holding member 330 to the electrical ground described above is provided.

The control substrate 420 includes an image processing unit, a control unit for various kinds of systems of the imaging apparatus, and a power supply circuit unit, and is fixed to the lower housing 410 with a fastening member (not illustrated), such as a screw. Further, a ground portion of the control substrate 420 is electrically connected to the lower housing 410 with the fastening member. The control substrate 420 performs, for example, compression coding processing on the acquired image signal to generate data to be distributed to various kinds of control apparatuses outside the imaging apparatus. The control substrate 420 according to the present exemplary embodiment includes one substrate; however, the number of the substrates is not limited thereto. For example, the control substrate 420 may include two or more substrates.

The base member 430 is a planar member that is fixed to the lower housing 410 with a screw (not illustrated) or other fastening member so as to cover the control substrate 420. A cylindrical portion 431 that includes a plurality of engagement parts 431a at a leading end thereof is formed at or approximately at a center of the base member 430, and a plurality of ribs 431b and a fitting hole 431c are formed around the cylindrical portion 431. In addition, a first extension part 432 and a second extension part 433 are formed outside the cylindrical portion 431, as viewed in an axis direction of the cylindrical portion 431, so as to substantially face each other across the cylindrical portion 431. The first extension part 432 defines a plane that is parallel to a plane in which the control substrate 420 fixed to the lower housing 410 extends and is shifted in an optical axis direction of the camera unit 200. As described below, the communication antenna 310 and the communication substrate 320 are fixed on a plane that is defined by the first extension part 432 as the protrusion.

A height of the first extension part 432 is set higher than a height of the bent part 332 of the wireless communication unit holding member 330. The second extension part 433 includes a side surface 433a that constitutes a circle concentric with the cylindrical portion 431. Further, an opening 434 into which the boss 411 of the lower housing 410 is inserted is provided on a planar part at a base of the first extension part 432. Moreover, a rib 435 is provided on a planar part at a base of the second extension part 433. On a top surface of the rib 435, ribs 437 and 438 each constituting a part of a circle concentric with the cylindrical portion 431 are formed.

The guide member 440 includes a box shape in which a side surface 440a has an arc shape substantially coincident with the side surface 433a of the base member 430. On a top surface of the guide member 440, ribs 441 and 442 each constituting a part of a circle concentric with the cylindrical portion 431 are formed so as to be substantially coincident with the ribs 437 and 438, respectively, of the base member 430. Further, the guide member 440 includes a cylindrical portion 443 that is internally fitted to the rib 435 of the base member 430. The guide member 440 is assembled by using known fastening means, such as a screw, and a snap-fit coupling (not illustrated) while the rib 435 of the base member 430 is fitted to the cylindrical portion 443 of the base member 430.

Next, assembly of the camera unit 200 and the wireless communication unit 300 to the lower housing unit 400 is described with reference to FIGS. 2, 6, 7A to 7C, and 8. The camera unit 200 is assembled to the lower housing unit 400 via the indirect urging member 450 and the urging member 460 so as to be rotatable about the optical axis of the camera unit 200.

The indirect urging member 450 includes a ring-shaped sheet metal member that includes a plurality of tongue-shaped portions 451 and to which a shaft 452 is swaged and fixed. The urging member 460 (e.g., compression coil spring) is assembled by being pressed into rib parts 431b provided around the cylindrical portion 431 of the base member 430. The indirect urging member 450 is assembled to the lower housing unit 400 by inserting the shaft 452 into the fitting hole 431c of the base member 430 such that the urging member 460 comes into contact with the tongue-shaped portion 451 of the indirect urging member 450.

In the assembly of the camera unit 200, the protrusion 222a of the boss 222 of the holder member 220 is brought into contact with a planar part of the indirect urging member 450. A rotational phase at this time is a rotational phase at which a phase of the gap 221c of the flange 221 of the holder member 220 is coincident with a phase of the engagement part 431a at the leading end of the cylindrical portion 431 of the base member 430. Then, the holder member 220 is inserted into the cylindrical portion 431 so that the sliding surface 221b of the holder member 220 slides on an inner peripheral surface of the cylindrical portion 431. After the insertion, the camera unit 200 is rotated up to a phase at which the bottom surface of the engagement part 431a of the base member 430 and the sliding surface 221a of the holder member 220 slide on each other. As a result, the lens barrel unit 210 of the camera unit 200 is rotatably supported by the base member 430.

The first telecommunication member 240 includes a part extended from the clamp-shaped portion 231a of the lens barrel cover member 230. The part is guided to a space surrounded by the rib 437 of the base member 430, the rib 441 of the guide member 440, the rib 438 of the base member 430, and the rib 442 of the guide member 440.

Further, the part is folded and disposed along the rotation direction of the camera unit 200 so as to form a folded part 243. The fixing end 241 of the first telecommunication member 240 is connected to a connector (not illustrated) of the control substrate 420. As a result, a ground part of each of the components electrically controlling the lens barrel unit 210 is also connected to the ground part of the control substrate 420.

The second telecommunication member 250 includes a part extended from the clamp-shaped portion 231*b* of the lens barrel cover member 230. The part is guided to a space surrounded by an outer peripheral side surface of the cylindrical portion 431 of the base member 430 and the side surface 440*a* of the guide member 440. Further, the part is folded and disposed along the rotation direction of the camera unit 200 so as to form a folded part 254. The fixing end 252 of the second telecommunication member 250 is connected to a connector (not illustrated) of the control substrate 420. As a result, the ground part of each of the components controlling the imaging device 211 and the like is also connected to the ground part of the control substrate 420.

The above-described configuration enables the camera unit 200 to be rotatable with respect to the lower housing unit 400 even in a state where the camera unit 200 and the lower housing unit 400 are electrically connected to each other. In the present exemplary embodiment, the lower housing unit 400 includes a not-illustrated member (driving end member) that determines rotation driving ends of the camera unit 200 so as to prevent the camera unit 200 from being rotated excessively. Further, a length of each of the first telecommunication member 240 and a length of the second telecommunication member 250 are set corresponding to the driving end member. More specifically, the length and the folded position of each of the folded parts 243 and 254 are set so that the folded parts 243 and 254 do not cross the clamp-shaped portions 231*a* and 231*b* of the lens barrel cover member 230 toward the fixing ends 241 and 252, respectively, in the case where the camera unit 200 is rotated up to the driving end member.

The wireless communication unit 300 is desirably disposed so that the communication antenna 310 is directed toward the cylindrical portion 431 of the base member 430. Accordingly, the planar part 331 of the wireless communication unit holding member 330 is placed on a top surface of the first extension part 432 of the base member 430 so that the communication antenna 310 is directed to the cylindrical portion 431. In this state, the wireless communication unit 300 is fixed to the base member 430 with a screw (not illustrated) or other fastening member. Further, the bent part leading end 332*a* of the wireless communication unit holding member 330 is fixed to the boss 411 of the lower housing 410 with a screw (not illustrated) or other fastening member. As a result, the feeding point 311 of the communication antenna 310 is connected to the electrical ground of the imaging apparatus.

The camera unit 200 is rotated as described above for adjustment of a viewing angle, for example, after the imaging apparatus 100 is installed. In this case, for example, the camera unit 200 can be at an end position in a positive direction of the rotation direction (FIG. 7A), an end position in a negative direction thereof (FIG. 7C), and a rotation position therebetween (e.g., intermediate position (FIG. 7B)).

Figure 7A:
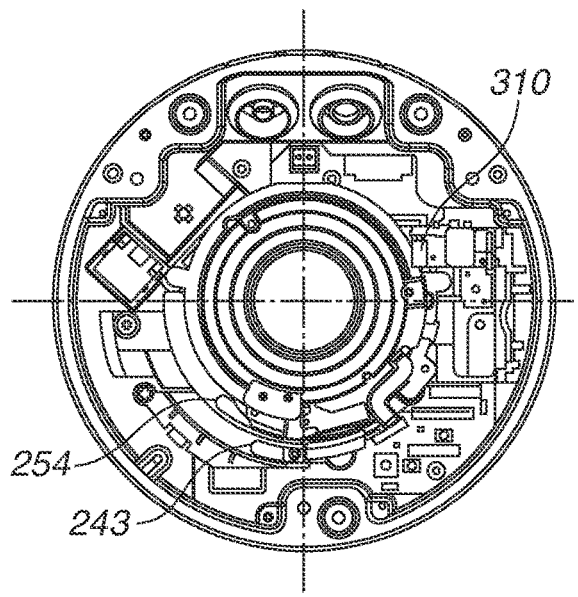
FIGS. 7A to 7C are top views each illustrating the imaging apparatus with an upper housing unit removed in a case where the camera unit of the imaging apparatus according to the exemplary embodiment rotates.
Figure 7B:
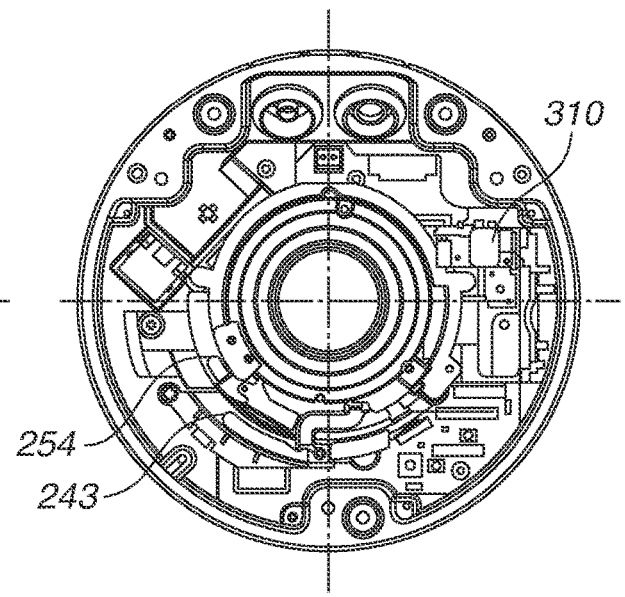
Figure 7C:
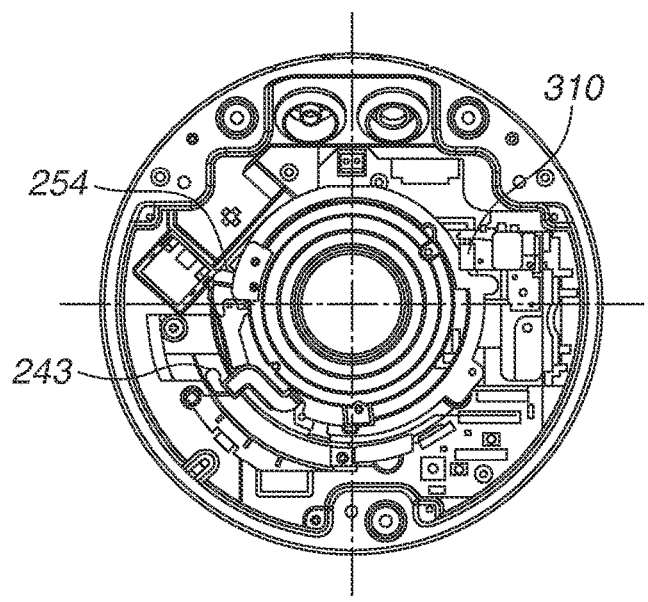

As illustrated in FIGS. 7A to 7C, according to the present exemplary embodiment, the folded parts 243 and 254 of the telecommunication members 240 and 250, respectively, are disposed so as to substantially face the communication antenna 310 across the lens barrel unit 210 as viewed in the rotation axis direction of the camera unit 200. Accordingly, it is possible to sufficiently separate the first telecommunication member 240 and the second telecommunication member 250 from the communication antenna 310. This makes it possible to reduce an influence of noise of the first telecommunication member 240 and the second telecommunication member 250 exerted to the wireless communication unit 300. In addition, since the wireless communication unit 300 is fixed to the first extension part 432 of the base member 430, it is possible to sufficiently separate the control substrate 420 and the communication antenna 310 from each other. This makes it possible to also reduce an influence of noise of the control substrate 420 exerted to the wireless communication unit 300.

Figure 9:
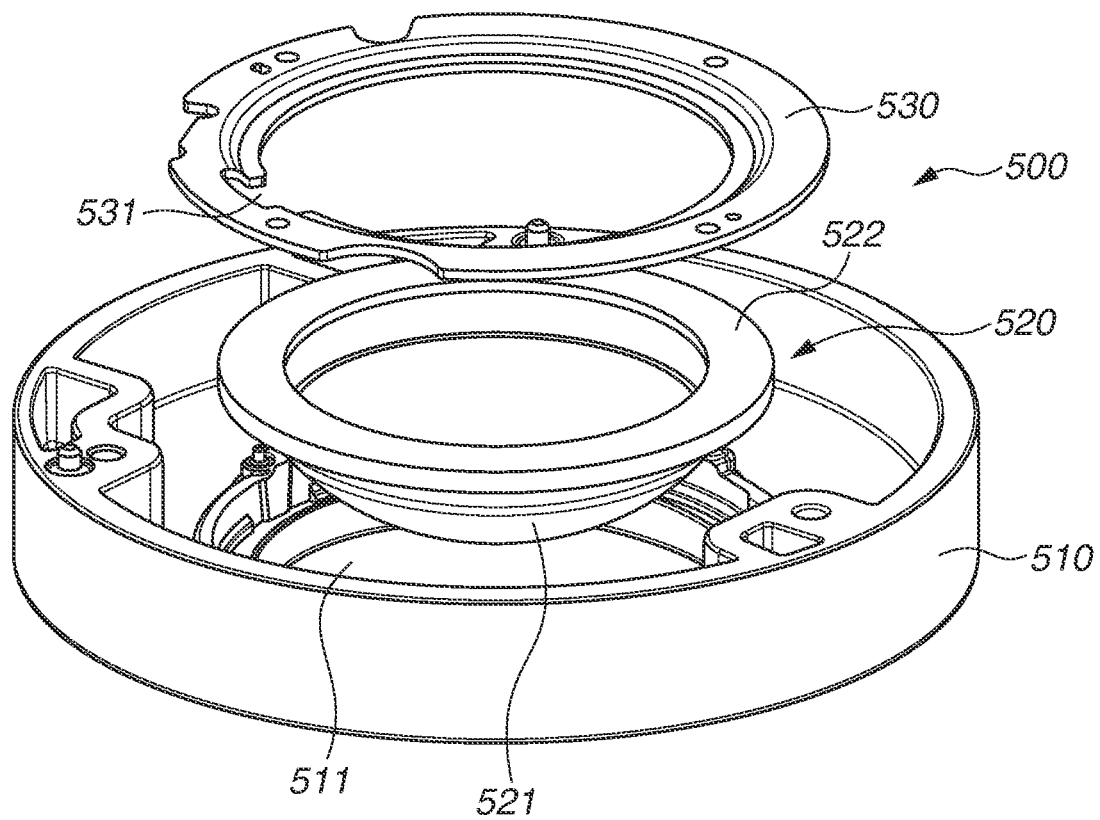
FIG. 9 is an exploded perspective view illustrating the upper housing unit of the imaging apparatus according to the exemplary embodiment.
Figure 10:
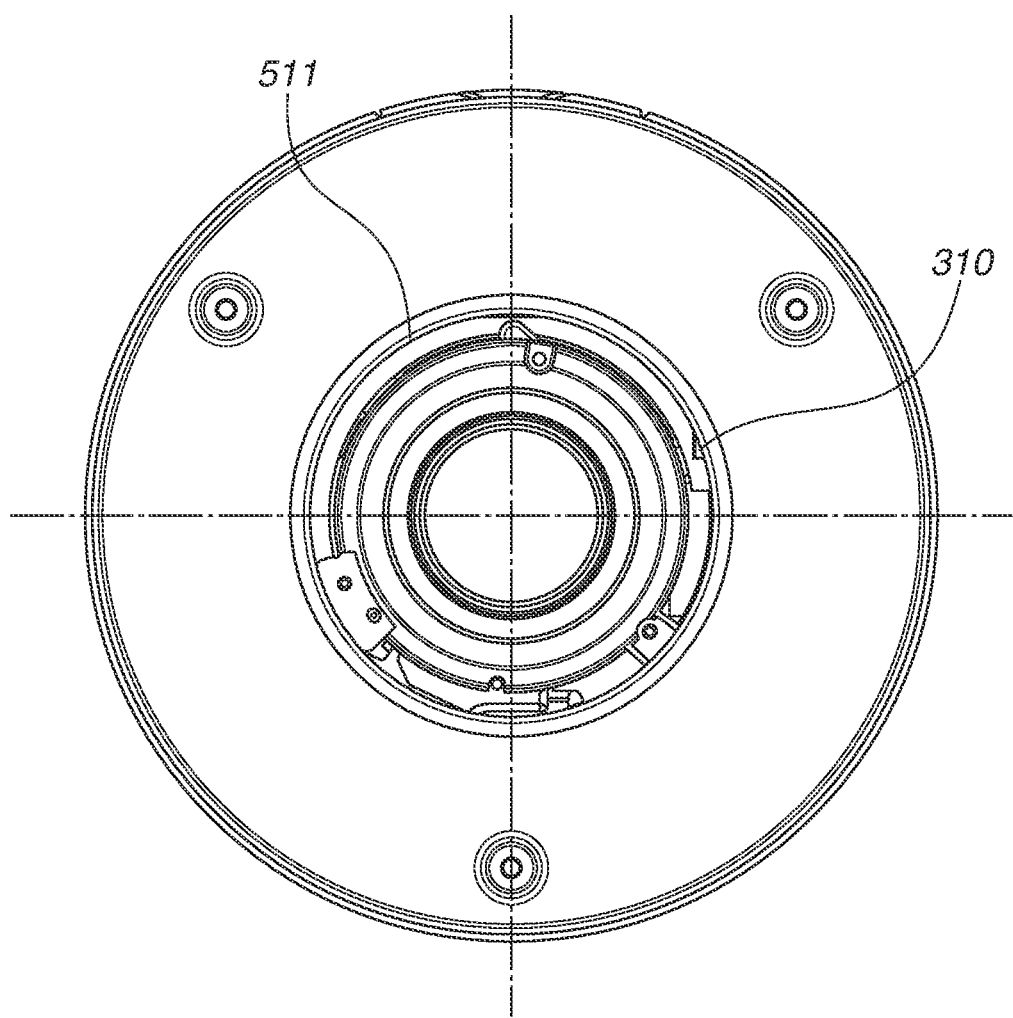
FIG. 10 is a top view illustrating the imaging apparatus in a case where non-metallic components other than the camera unit in the imaging apparatus according to the exemplary embodiment are removed.

The configuration of the upper housing unit 500 is described with reference to FIG. 9 and FIG. 10. To facilitate understanding of the configuration of the upper housing unit 500, the upper housing unit 500 is illustrated upside down. The upper housing unit 500 includes an upper housing 510, a dome cover 520, and a holding member 530. The upper housing 510 is a substantially cylindrical member including an electromagnetic shielding member formed of, for example, a molded member of a metal, such as aluminum and magnesium. A bottom surface of the cylindrical shape of the upper housing 510 facing the lower housing unit 400 is open. A circular opening 511 to guide light is provided on a top surface of the upper housing 510, and the upper housing 510 is fixed to the lower housing 400 to which the camera unit 200 is attached so as to cover the camera unit 200. An inner diameter of the opening 511 of the upper housing 510 is set larger than a half-wavelength of the radio wave of the wireless communication unit 300. Further, the inner diameter is set so as to enable visual recognition of a part of the communication antenna 310 of the wireless communication unit 300 as viewed in the rotation axis direction of the camera 200 while the upper housing unit 500 and the lower housing unit 400 are assembled to each other.

The dome cover 520 is formed of a non-electromagnetic shielding material, such as a transparent or translucent resin member. The dome cover 520 includes a protrusion 521 having a spherical curved surface and a flange 522. The holding member 530 is a ring-shaped member that is formed of, for example, a sheet metal, and includes a cut-off portion 531 on an inner diameter side. A position and a size of the cut-off portion 531 are determined so as to enable visual recognition of the communication antenna 310 of the wireless communication unit 300 as viewed in the rotation axis direction of the camera unit 200 while the upper housing unit 500 and the lower housing unit 400 are assembled to each other. The holding member 530 is fixed to the upper housing 510 with a fastening member (not illustrated), such as a screw, and the dome cover 520 is interposed therebetween.

The above-described configuration makes it possible to radiate the radio wave to outside without projection of the communication antenna 310 of the wireless communication unit 300 from an outer shape of each of the lower housing unit 400 and the upper housing unit 500. Accordingly, unlike in the existing configuration discussed in Japanese Patent Application Laid-Open No. 2007-60237 that includes a wireless communication antenna projecting from a metal external housing, for example, it is possible to secure a sufficient wireless communication function using the gap with the opening 511 provided around the camera unit 200. Thus, the imaging apparatus according to the present exemplary embodiment can reduce an influence of a noise from another control unit during the wireless communication and can eliminate an exterior cover dedicated for the antenna to achieve the wireless communication function. This makes it possible to optimize a layout of the components inside the imaging apparatus without considering the layout of the antenna, and to prevent an increase in the device size and in the number of components in order to achieve the desired wireless communication function.

As described above, the imaging apparatus according to the exemplary embodiment includes the housing (410 and 510) having the opening 511, the camera unit 200, the telecommunication members (240 and 250), and the communication antenna 310. The housing has the electromagnetic shielding property and is divided into the upper housing 510 and the lower housing 410 in the present exemplary embodiment. Alternatively, the housing may be constituted of a single component or may be divided into a larger number of components as long as the housing can house the components to be housed in the housing. Further, in the present exemplary embodiment, a metal is used as the material of the housing; however, any other known material, such as a resin, can be used for the housing from a viewpoint of weatherability, workability, cost, etc. In a case where the housing is divided into the upper housing and the lower housing as in the present explary embodiment, the control substrate 420 is desirably fixed to the lower housing 410, and the camera unit 200 is desirably disposed so as to be rotatable around the optical axis of the camera unit 200. In this case, the upper housing 510 is desirably fixed to the lower housing 410 so as to cover the camera unit 200 and desirably has the opening 511. Further, from a viewpoint of protection of the camera unit 200, such as the lens, and a viewpoint of transmission of radio waves, the opening 511 is desirably covered with the cover member (520) that has translucency but does not have an electromagnetic shielding property. In the above description, the divided housings are distinguished as the upper housing and the lower housing. However, the housings are referred to as the upper and the lower only for convenience of distinction, and the upper and the lower do not intend to represent a specific arrangement thereof. Accordingly, the components may be grasped as a first housing and a second housing.

In the present exemplary embodiment, the camera unit 200 includes the lens (single lens or plurality of lenses) and the imaging device 211 and is disposed in the lower housing 410 so as to be rotatable about the optical axis of the camera unit 200 to image an external object through the opening 511. In addition, the first telecommunication member 240 and the second telecommunication member 250 are described as the telecommunication members in the present exemplary embodiment. However, the telecommunication members are not limited thereto, and may include various kinds of telecommunication members including at least the telecommunication member that connects the control substrate 420 for controlling the camera unit 200 and the imaging device 211 of the camera unit 200. In the present exemplary embodiment, the camera unit 200 is rotatable about the optical axis. However, the camera unit 200 may not be rotatable depending on flexibility in assembly, use application, etc.

In the present exemplary embodiment, the communication antenna 310 is disposed at a position substantially symmetrical to the telecommunication members (240 and 250) across the lens that is included in the camera unit 200, inside the lower housing 410. This makes it possible to reduce an influence of noise from another control unit during the wireless communication as described above. In the present exemplary embodiment, the camera unit 200 is rotatable about the optical axis thereof. Thus, even if the communication antenna 310 and the telecommunication members (240 and 250) are disposed precisely symmetrical to each other, there may be a case where the camera unit 200 is used while the communication antenna 310 and the telecommunication members (240 and 250) are at deviated positions due to the rotation. Accordingly, a positional relationship between the communication antenna 310 and the telecommunication members (240 and 250) may be grasped as a substantially symmetrical relationship that includes a range considering a rotation range of the camera unit 200 with a precisely symmetrical position at the center thereof. Further, the communication antenna 310 is at least partially disposed in a gap between an inner edge of the opening 511 and the camera unit 200 as viewed in the optical axis direction of the camera unit 200. The communication antenna 310 is disposed in such a manner so that communication can be performed from a region where the electromagnetic shielding member is not provided and where a non-electromagnetic shielding member for protecting the lens is provided.

In the present exemplary embodiment, each of the telecommunication members (240 and 250) is a flexible member including a flexible printed circuit board or a thin coaxial cable. The second telecommunication member 250 as an example of the telecommunication members includes, for example, the fixing end 252 connected to the control substrate 420 and the free end 251 connected to the imaging device 211 via the imaging device substrate 212.

Each of the telecommunication members (240 and 250) may not be entirely flexible. For example, only a part of each of the telecommunication members (240 and 250) that is disposed in an are shape around the rotation axis or the optical axis of the camera unit 200 may be a flexible part. In addition, the lens barrel (lens barrel unit 210) of the camera unit 200 is rotatably supported by the base member 430. The base member 430 desirably includes the ribs (437 and 438) that guide the flexible part or a bent part of each of the telecommunication members (240 and 250). Providing such ribs (437 and 438) makes it possible to suppress interference with a flexible part of another member and to assist smooth operation of the flexible part.

The imaging apparatus according to the present exemplary embodiment includes the communication substrate 320 on which the above-described communication antenna 310 is mounted. Similar to the communication antenna 310, the communication substrate 320 is also desirably disposed in the lower housing 410 at a position substantially symmetrical to the telecommunication members (240 and 250) across the lens that is included in the camera 200. This makes it possible to further reduce an influence of noise from another control unit during the wireless communication. The above-described base member 430 includes the protrusion (first extension part 432) in the present exemplary embodiment, and the protrusion (first extension part 432) defines a plane that is shifted in the optical axis direction of the camera unit 200 from the plane on which the control substrate 420 is disposed. The communication substrate 320 and the communication antenna 310 are fixed to the protrusion (first extension part 432). As a result, the communication members are sufficiently isolated from the control substrate 420 as viewed in the optical axis direction and also in the optical axis direction in the housing (400 and 500). This makes it possible to further reduce an influence of noise from another control unit during the wireless communication.

As described above, the bent part leading end 332a of the wireless communication unit holding member 330 is fixed to the boss 411 of the lower housing 410, for example with a screw (not illustrated). As a result, the feeding point 311 of the communication antenna 310 is electrically connected to the electrical ground of the imaging apparatus, i.e., to the lower housing 410, as a ground part of the communication substrate 320. The ground part of the imaging device substrate 212 is also electrically connected to the lower housing 410 via the control substrate 420. As a result, the ground part of the communication substrate 320 is electrically connected to each of the housings (400 and 500) and the imaging device substrate 212.

Further, as described above, the opening 511 desirably has a circular shape having an opening diameter greater than or equal to a half-wavelength of the radio wave transmitted from the communication antenna 310. The opening 511 configured in such a manner makes it possible to secure a more desirable communication function. For a similar reason, a region formed by connecting a point on the communication antenna 310 with the opening 511 is also desirably considered. In other words, in a region not including the electromagnetic shielding member within such region, at least part of a cross-section orthogonal to the optical axis direction of the camera unit 200 desirably has a length greater than or equal to the half-wavelength of the radio wave transmitted from the communication antenna 310.

The prevent disclosure has described exemplary embodiments in detail; however, some embodiments are not limited to the described exemplary embodiments. Some embodiments include various other modes, such as modes equivalent to the described exemplary embodiments. Further, the above-described exemplary embodiments can be partially combined as appropriate within a suitable range.

While the present disclosure has described exemplary embodiments, it is to be understood that the claims are not limited to the disclosed exemplary embodiments. The scope of the following claims is to be accorded the broadest interpretation so as to encompass all such modifications and equivalent structures and functions.

This application claims priority to Japanese Patent Applications No. 2018-073304, which was filed on Apr. 5, 2018, and No. 2018-083416, which was filed on Apr. 24, 2018, both of which are hereby incorporated by reference herein in their entireties.

What is claimed is:

1. An imaging apparatus, comprising:
a housing having an opening;
a camera unit including a lens and an imaging device, disposed inside the housing, and configured to image an external object through the opening;
a base member configured to rotatably support the camera unit;
a telecommunication member disposed inside the housing and configured to connect a control substrate controlling the camera unit to an imaging device substrate on which at least the imaging device of the camera unit is mounted; and
a communication antenna at least partially disposed between an edge of the opening and the camera unit as viewed in an optical axis direction of the lens at a position substantially symmetrical to the telecommunication member across the camera unit,
wherein the telecommunication member includes a flexible part that is disposed in an arc shape around an optical axis of the lens,
wherein the base member includes a guiding portion for guiding the flexible part.

2. The imaging apparatus according to claim 1,
wherein the camera unit is rotatable about an optical axis, and
wherein the housing includes a first housing to which the control substrate is fixed and in which the camera unit is provided to be rotatable about the optical axis, and a second housing fixed to the first housing so as to cover the camera unit and having the opening.

3. The imaging apparatus according to claim 1, wherein the telecommunication member includes a fixing end connected to the control substrate and a free end connected to the imaging device substrate.

4. The imaging apparatus according to claim 1, wherein the telecommunication member is a flexible printed-circuit board or a thin coaxial cable.

5. The imaging apparatus according to claim 1, further comprising a communication substrate on which the communication antenna is disposed,
wherein the communication substrate is disposed at a position substantially symmetrical to the telecommunication member across the camera unit inside the housing.

6. The imaging apparatus according to claim 5, further comprising a protrusion configured to define a plane that is shifted in the optical axis direction of the camera unit from a plane on which the control substrate is disposed,
wherein the communication substrate and the communication antenna are fixed to the protrusion.

7. The imaging apparatus according to claim 5, wherein a ground part of the communication substrate is electrically connected to each of the housing and the imaging device substrate.

8. The imaging apparatus according to claim 1, wherein the opening has a circular shape including an opening diameter greater than or equal to a half-wavelength of a radio wave transmitted from the communication antenna.

9. The imaging apparatus according to claim 1, further comprising a translucent cover member configured to cover the opening.

* * * * *